United States Patent
Sakai et al.

(10) Patent No.: US 10,192,738 B2
(45) Date of Patent: Jan. 29, 2019

(54) METHODS OF PRODUCING SEED CRYSTAL SUBSTRATES AND GROUP 13 ELEMENT NITRIDE CRYSTALS, AND SEED CRYSTAL SUBSTRATES

(71) Applicant: NGK INSULATORS, LTD., Nagoya, Aichi (JP)

(72) Inventors: Masahiro Sakai, Nagoya (JP); Takashi Yoshino, Ama (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 15/699,122

(22) Filed: Sep. 8, 2017

(65) Prior Publication Data

US 2017/0372889 A1    Dec. 28, 2017

Related U.S. Application Data

(63) Continuation of application No. PCT/JP2017/000948, filed on Jan. 13, 2017.

(30) Foreign Application Priority Data

Mar. 24, 2016 (JP) ................................. 2016-060185

(51) Int. Cl.
| | |
|---|---|
| *H01L 21/02* | (2006.01) |
| *C30B 19/12* | (2006.01) |
| *C30B 1/02* | (2006.01) |
| *C30B 29/40* | (2006.01) |
| *C30B 33/08* | (2006.01) |

(Continued)

(52) U.S. Cl.
CPC .......... *H01L 21/0254* (2013.01); *C30B 1/023* (2013.01); *C30B 19/02* (2013.01); *C30B 19/12* (2013.01); *C30B 29/406* (2013.01); *C30B 33/06* (2013.01); *C30B 33/08* (2013.01); *H01L 21/0242* (2013.01); *H01L 21/0262* (2013.01);
(Continued)

(58) Field of Classification Search
CPC ... H01L 21/0254; C30B 29/406; C30B 33/08; C30B 1/023
See application file for complete search history.

(56) References Cited

U.S. PATENT DOCUMENTS

| | | | |
|---|---|---|---|
| 2010/0044718 A1* | 2/2010 | Hanser | ................... C30B 25/02 257/76 |
| 2010/0107969 A1* | 5/2010 | Kuraoka | ................ C30B 23/02 117/68 |

(Continued)

FOREIGN PATENT DOCUMENTS

| | | |
|---|---|---|
| JP | 4886711 B2 | 2/2012 |
| WO | WO 2009/011407 A1 | 1/2009 |

(Continued)

OTHER PUBLICATIONS

International Search Report for PCT/JP2017/000948 (2 pages).

*Primary Examiner* — Joseph Galvin, III
(74) *Attorney, Agent, or Firm* — Flynn Thiel, P.C.

(57) ABSTRACT

A seed crystal layer is provided on a supporting body. A laser light is irradiated from a side of the supporting body to provide an altered portion along an interface between the supporting body and seed crystal layer. The altered layer is composed of a nitride of a group 13 element and has a portion into which dislocation defects are introduced or an amorphous portion.

11 Claims, 5 Drawing Sheets

(51) Int. Cl.
   *C30B 19/02*        (2006.01)
   *C30B 33/06*        (2006.01)
(52) U.S. Cl.
   CPC .. *H01L 21/02458* (2013.01); *H01L 21/02694* (2013.01)

(56) References Cited

U.S. PATENT DOCUMENTS

2012/0018732 A1   1/2012  Aida et al.
2014/0103362 A1*  4/2014  Kuraoka ................ C30B 19/02
                                                                     257/76
2015/0368832 A1*  12/2015  Aida ..................... C30B 25/186
                                                                     257/76

FOREIGN PATENT DOCUMENTS

| WO | WO 2010/082267 A1 | 7/2010 |
| --- | --- | --- |
| WO | WO 2014/034338 A1 | 3/2014 |
| WO | WO 2014/123171 A1 | 8/2014 |

* cited by examiner

METHODS OF PRODUCING SEED CRYSTAL SUBSTRATES AND GROUP 13 ELEMENT NITRIDE CRYSTALS, AND SEED CRYSTAL SUBSTRATES

CROSS-REFERENCE TO RELATED APPLICATIONS

This is a continuation of International Application No. PCT/JP2017/000948, filed Jan. 13, 2017, which claims priority of Japanese Patent Application No. 2016-060185, filed Mar. 24, 2016, the entire contents of which are incorporated herein by reference.

TECHNICAL FIELD

The present invention relates to a seed crystal substrate for growing gallium nitride or the like, a method of producing the same and a method of producing a crystal of a nitride of a group 13 element.

BACKGROUND ARTS

According to patent document 1, it is proposed to form an intermediate layer with a low hardness on a sapphire substrate, to form a seed crystal substrate of gallium nitride thereon and to grow a thick film of gallium nitride by the flux method. The thick film of gallium nitride is separated from the sapphire substrate during the cooling step.

Further, according to patent document 2, when a seed crystal film is formed on a sapphire substrate, voids are formed along an interface of the sapphire substrate and seed crystal film. Then, during the cooling step after a thick film of gallium nitride is formed on the seed crystal film, the thick film of gallium nitride is spontaneously separated from the sapphire substrate.

According to patent document 3, when a seed crystal film is formed on a sapphire substrate, voids are formed along an interface between the sapphire substrate and seed crystal film and the void ratio is adjusted at a value of 12.5 percent or lower. Cracks or defects in gallium nitride crystal grown on the seed crystal film are thereby reduced.

RELATED DOCUMENTS (Patent Documents)
(Patent document 1) Japanese patent No. 4886711B
(Patent document 2) WO 2009/011407
(Patent document 3) WO 2014/034338

SUMMARY OF THE INVENTION

However, according to the production methods of patent documents 1 and 2, parts are left where the gallium nitride layer and supporting body are not spontaneously separated and are adhered to each other, resulting in a reduction of a production yield. It was further found the tendency that the bowing of the thus obtained gallium nitride layer is large. Particularly, as the area of the supporting body becomes large, the increase of the cracks or bowing tends to be observed, which is problematic.

According to the method of patent document 3, it is possible to grow gallium nitride layer of a high quality. However, this method provides a template substrate having the supporting body and the gallium nitride layer integrated with it, and does not provide a free-standing substrate composed of the gallium nitride layer.

Further, according to the method of patent documents 3, as the thickness of the seed crystal layer is as thin as several microns, for example, in the case that the gallium nitride along the interface is subjected to thermal decomposition in a region of laser irradiation, the gallium nitride layer is scattered by the shock of the thermal decomposition. Gallium nitride thereby disappears in the laser irradiation region to form voids. However, when a gallium nitride layer is then grown on the seed crystal film by the flux method, the seed crystal may become molten back into a melt at the void parts (gallium nitride crystal of the seed crystal becomes molten into the melt until nitrogen is saturated), so that the seed crystal layer may disappear. For preventing the disappearance of the seed crystal layer, it is necessary to form the seed crystal film again by a vapor phase growing method, which is problematic.

An object of the present invention is, in growing a crystal of a nitride of a group 13 element on a seed crystal substrate, to reduce cracks in the thus obtained crystal of the nitride of the group 13 element and to improve the production yield.

The present invention provides a method of producing a seed crystal substrate, the method comprising the steps of:
providing a seed crystal layer comprising a nitride of a group 13 element on a supporting body; and
irradiating a laser light from a side of said supporting body to provide an altered portion comprising the nitride of the group 13 element along an interface between the supporting body and the seed crystal layer, the altered portion comprising a dislocation defects introduced portion or an amorphous portion.

The present invention further provides a method of producing a crystal of a nitride of group 13 element, the method comprising the steps of:
providing a seed crystal layer comprising a nitride of a group 13 element on a supporting body;
irradiating a laser light from a side of said supporting body to provide an altered portion comprising the nitride of the group 13 element along an interface between the supporting body and the seed crystal layer, the altered portion comprising a dislocation defects introduced portion or an amorphous portion; and
providing the crystal of the nitride of the group 13 element on the seed crystal layer.

The present invention further provides a seed crystal substrate comprising:
a supporting body;
a seed crystal layer comprising a nitride of a group 13 element on a supporting body; and
an altered portion comprising the nitride of the group 13 element along an interface between the supporting body and the seed crystal layer, the altered portion comprising a dislocation defects introduced portion or an amorphous portion.

In the case that the laser light is irradiated from a side of a supporting body, if an optical energy is small, a seed crystal present along an interface of the supporting body does not respond to the laser light. On the other hand, according to patent document 3, if the optical energy is made too large, so that the seed crystal present along the interface along the supporting body is decomposed to metal atoms and nitrogen atoms, the seed crystal scatters to form voids.

On the other hand, the present inventors adjusted the optical energy of the laser light, thickness of the seed crystal film or the like to realize the conditions that the voids are not generated along the interface between the supporting body and seed crystal layer.

Then, the thus obtained seed crystal substrate was analyzed to prove that the seed crystal was altered to provide an altered layer, which was confirmed along the interface between the seed crystal layer and supporting body. Specifically, a differential interference contrast microscope is used and the focal point is gradually shifted from the surface of the seed crystal in the direction of depth. As a result, it was observed a region having different contrast along the interface between the seed crystal and supporting body. Further, according to observation using a transmission type electron microscope of a cross section of the interface between the seed crystal and supporting body, contrast of a different color was observed in the same region. This region having a different contrast was proved to be the altered layer into which dislocation defects were introduced. Further, the seed crystal may be changed to an amorphous structure. In this case, it is proved that the diffraction contrast due to the crystal was not present and a bright and uniform image is observed.

As such, in the case that it is provided the altered portion into which the dislocation defects are introduced or whose structure was altered to amorphous along the interface between the supporting body and seed crystal layer, after a crystal of a nitride of a group 13 element is grown on the seed crystal layer, it is proven that cracks are prevented directly after the growth of the crystal of the nitride of the group 13 element.

Then, when the crystal of the nitride of the group 13 element is grown on the seed crystal substrate in which the altered portion is formed, cracks are prevented directly after the formation of the crystal. Then, it is proven that the crystal of the nitride of the group 13 element can be easily separated from the supporting body, the cracks are considerably prevented in the crystal of the nitride of the group 13 element directly after the separation and the yield is improved. In addition to this, it is proven that the bowing of the substrate is improved.

MODES FOR CARRYING OUT THE INVENTION

The present invention will be described in detail below, with reference to the accompanying drawings.

Figure 1A:
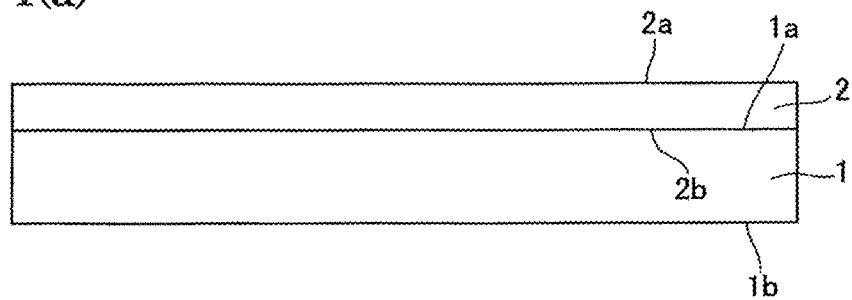
FIG. 1(a) shows the state that a seed crystal layer 2 is provided on a supporting body 1.

As shown in FIG. 1, a seed crystal film 2 is formed on a main face 1a of a supporting body 1. 1b represents a bottom face of the supporting body 1. According to the present example, an interface 2b and a surface 2a are formed in the seed crystal film 2.

Figure 1B:
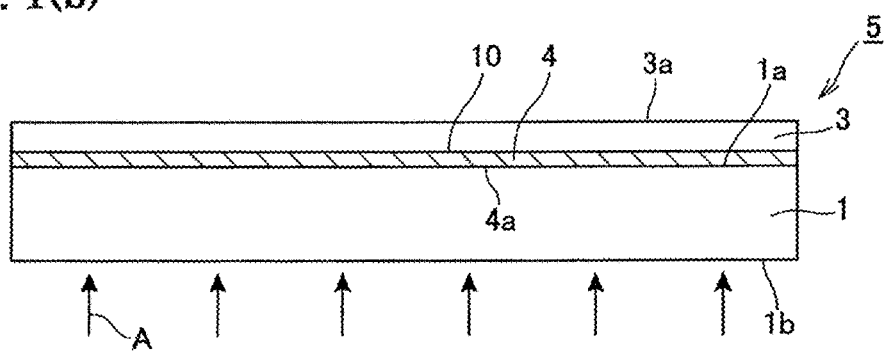
FIG. 1(b) shows the state that an altered portion 4 is provided in the seed crystal layer 3.

Then, as shown in FIG. 1(b), a laser light is irradiated from a side of the bottom face 1b of the supporting body 1 as arrows A. The laser light penetrates through the supporting body 1 and reaches an interface between the seed crystal layer and supporting body. Here, the energy of the laser light is adjusted so that the altered layer 4 is generated along the interface. A main face 4a of the altered layer 4 contacts a main face 1a of the supporting body 1. According to the present example, as the laser light A is irradiated uniformly over the whole surface of the seed crystal layer 3, the altered portion 4 is generated over the whole surface of the seed crystal layer 3. 10 represents an interface between the seed crystal layer 3 and the altered portion 4, 3a represents a crystal growing face and 5 represents a seed crystal substrate.

Figure 1C:
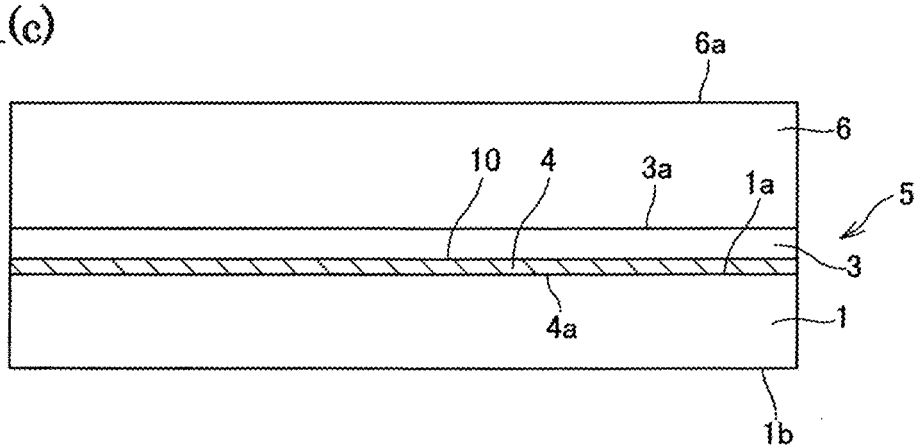
FIG. 1(c) shows the state that a crystal 6 of a nitride of a group 13 element is provided on a seed crystal substrate 5.

Then, as shown in FIG. 1(c), a crystal 6 of a nitride of a group 13 element is grown on the growing face 3a of the seed crystal layer 3. 6a represents a growing face of a functional device. At this stage, it is possible to utilize the crystal 6 of the nitride of the group 13 element as a template substrate without separating from the supporting body 1. However, according to a preferred embodiment, the crystal 6 of the nitride of the group 13 element is separated from the supporting body to obtain a free-standing substrate, which is used as the template substrate.

Figure 2A:
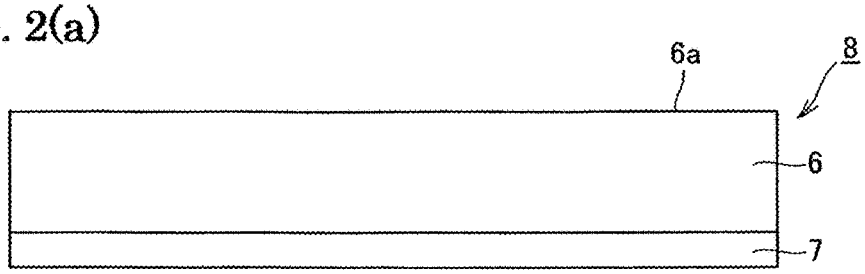
FIG. 2(a) shows a free-standing substrate 8 separated from the supporting body, and FIG. 2 (b) shows the state that a functional device 9 is formed on the free-standing substrate 8.
Figure 2B:
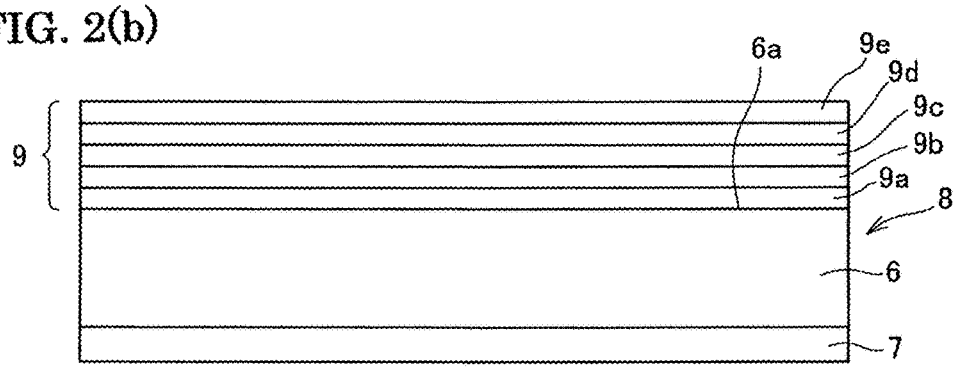

That is, the crystal 6 of the nitride of the group 13 element is separated from the supporting body to obtain a free-standing substrate 8 shown in FIG. 2 (a). According to the present example, the free-standing substrate 8 includes the crystal 6 and adhered parts 7 adhered onto the side of the bottom face. However, the crystal structure of the adhered part may be integrated with that of the crystal 6, or the adhered part may be omitted.

A functional device structure is then formed on the crystal 6 of the nitride of the group 13 element. Although the kind of functional device structure is not particularly limited, a light-emitting device is exemplified. Further, a plurality of the functional devices may be formed on the crystal. For example, according to an example shown in FIG. 2 (b), the light emitting device structure 9 is formed on the crystal. The light emitting device structure 9 includes an n-type contact layer 9a, an n-type clad layer 9b, an active layer 9c, p-type clad layer 9d and a p type contact layer 9e on the crystal 6 of the nitride of the group 13 element.

According to an example shown in FIG. 1, a laser light is irradiated uniformly onto the whole surface of the seed crystal layer, so that the altered layer is formed over the whole surface of the seed crystal layer. However, the laser light may be irradiated onto a part of the seed crystal layer, so that the altered layer may be patterned. For example, as shown in FIGS. 3 (a) to (c), regions with the altered layer and regions without the altered layer are alternately and regularly formed.

Figure 3A:
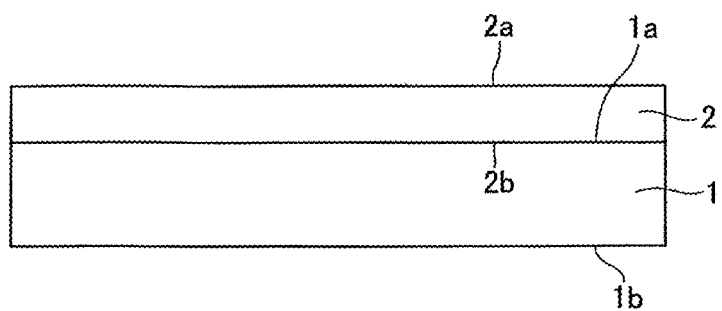
FIG. 3(a) shows the state that the seed crystal layer 2 is provided on the supporting body 1, FIG. 3 (b) shows the state that patterned altered portions 14 are provided in a seed crystal layer 13.
Figure 3B:
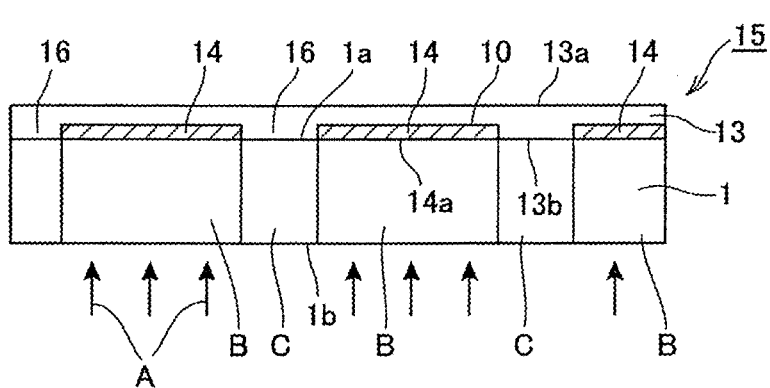
FIG. 3(c) shows the state that the crystal 6 of the nitride of the group 13 element is formed on the seed crystal layer 13.
Figure 3C:
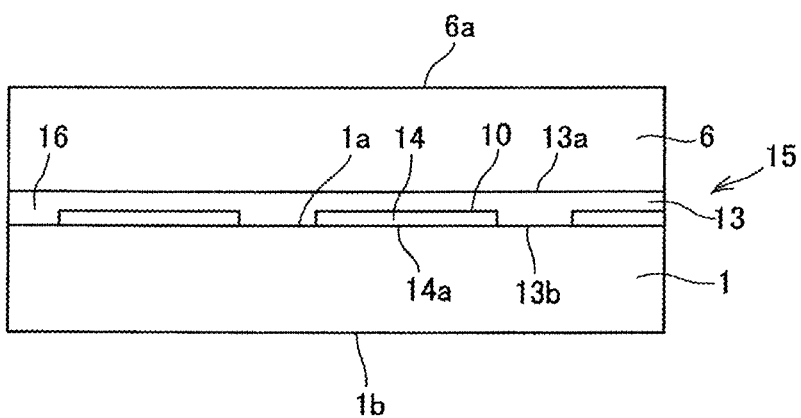

That is, as shown in FIG. 3 (a), the seed crystal film 2 is formed on a main face 1a of the supporting body 1. Then, as shown in FIG. 3 (b), laser light is irradiated from the side of the bottom face 1b of the supporting body 1 as arrows A. The laser light penetrates through the supporting body 1 and reaches the interface between the seed crystal layer and supporting body. Here, the energy of the laser light is adjusted so that the altered layer 4 is generated along the interface. At this time, regions B to which the laser light is irradiated and regions C to which the laser light is not irradiated are arranged so that they are adjacent to each other. As a result, in the regions B to which the laser light is irradiated, altered layers 14 are generated, and an interface 14a of the altered layer 14 contacts the surface of the supporting body 1. On the other hand, in the regions C to which the laser light is not irradiated, the altered layer 14 is not generated and a main face of the seed crystal layer 13 contacts the surface of the supporting body. As a result, along the interface between the supporting body 1 and seed crystal layer 13, the altered layers 14 and seed crystal parts 16 are adjacent to each other and alternately formed. 15 denotes a seed crystal substrate.

Then, as shown in FIG. 3 (c), the crystal 6 of the nitride of the group 13 element is grown on the growing face 13a of the seed crystal layer 13. 6a denotes a growing face of the functional device. At this stage, it is possible to utilize the crystal 6 of the nitride of the group 13 element as a template substrate without separating from the supporting body 1. However, according to a preferred embodiment, the crystal 6 of the nitride of the group 13 element is separated from the supporting body to obtain a free-standing substrate, which is used as the template substrate.

Elements of the present invention will be described further below.

According to the present invention, a seed crystal layer composed of a nitride of a group 13 element is provided on a supporting body.

Here, the material of the supporting body is selected so as to have a band gap larger than that of the nitride of the group 13 element formed on the seed crystal layer. In the case that the nitride of the group 13 element formed on the seed crystal layer is gallium nitride, its band gap is about 3.4 eV, so that sapphire, gallium oxide or AlxGa1-xN(0<x≤1) may be exemplified as the material of the supporting body.

The bottom face of the supporting body opposite to the seed crystal layer may be a mirror face or rough surface, and may preferably be a rough surface. Thus, after the laser light incident into the supporting body is scattered at the bottom face of the supporting body, the laser light is irradiated onto the seed crystal layer along the interface. It is possible to reduce the influence of the beam profile of the laser beam. In the case that the bottom face of the supporting body opposite to the seed crystal layer is the rough surface, the surface roughness Ra of the rough surface may preferably be 0.1 to 2 μm.

On the viewpoint of preventing the cracks in the supporting body directly after the cooling step, the thickness of the supporting body may preferably be 0.5 mm or larger and more preferably be 1 mm or larger. Further, on the viewpoint of the handling, the thickness of the supporting body may preferably be 3 mm or smaller.

The seed crystal layer composed of the nitride of the group 13 element is provided on the supporting body. When the seed crystal layer is formed, an underlying film is preferably provided on the supporting body and the seed crystal layer is subsequently grown thereon.

A method of forming the underlying film is preferably vapor phase epitaxy process. Examples of such a method include Metal Organic Chemical Vapor Deposition (MOCVD), Hydride Vapor Phase Epitaxy (HVPE), Molecular Beam Epitaxy (MBE) and sublimation.

The seed crystal layer may be composed of a single layer or may include a buffer layer on the side of the sapphire body. A method for forming the seed crystal layer may preferably be a vapor phase epitaxy process, for example, and examples of such a method include Metal Organic Chemical Vapor Deposition (MOCVD), Hydride Vapor Phase Epitaxy (HVPE), Pulse-Excited Deposition (PXD), MBE and sublimation. Metal Organic Chemical Vapor Deposition is particularly preferred.

Further, the material of the seed crystal layer is a nitride of a group 13 element. Group 13 element means group 13 element according to the Periodic Table determined by IUPAC. The group 13 element is specifically gallium, aluminum, indium, thallium or the like.

Then, the laser light is irradiated from the side of the supporting body, so that it provides the altered portion composed of the nitride of the group 13 element along the interface between the supporting body and the seed crystal layer. Here, the altered portion is a portion into which dislocation defects are introduced or an amorphous portion.

The wavelength of the laser light is selected so that the wavelength has an energy, which is larger than a band gap of the nitride of the group 13 element forming the seed crystal layer to be processed and which is smaller than a band gap of the material of the supporting body. By this, when the laser light is irradiated from the side of the supporting body, the laser light penetrates through the supporting body and is then absorbed by the nitride of the group 13 element forming the seed crystal layer, so that the nitride is heated and processed.

The conversion between the energy (unit: eV) and wavelength (unit: nm) is calculated by the following approximation formula:

$$\lambda \approx 1240/E$$

wherein E is assigned to the energy and $\lambda$ is assigned to the wavelength.

For example, in the case that the supporting body is made of sapphire and the nitride of the group 13 element forming the seed crystal layer is gallium nitride, the band gaps are about 3.4 eV and about 8.6 eV, respectively. It is necessary that the wavelength of the laser light is selected in a range of 144 nm to 364 nm. As a laser light source, it may be listed the third, fourth and fifth harmonic waves of a Nd: YAG laser, F2 excimer laser, ArF excimer laser, KrF excimer laser, XeCl excimer laser, XeF excimer laser, the third and fourth harmonic waves of a YVO4 laser, and the third and fourth harmonic waves of a YLF laser. More preferable laser light sources include the third harmonic wave of a Nd: YAG laser and fourth harmonic wave of Nd:YAG laser and a KrF excimer laser.

The shape of irradiation of the laser may be a circle, ellipse, rectangle or line.

The profile of the laser may be adjusted through a beam profiler.

For adjusting the size and energy density of the irradiated laser light, the laser may be irradiated onto the substrate after passing through a lens, slit or aperture.

According to a preferred embodiment, it is preferred to use a pulse laser so that the pulse width is adjusted to prevent the generation of voids. On the viewpoint, the pulse width may preferably be 60 ns or smaller. Further, the size of the irradiation of the optical beam may preferably be 0.5 mm to 4 mm.

The energy density of the optical beam may preferably be 30 to 200 mJ/cm$^2$ and more preferably be 60 to 130 mJ/cm$^2$, on the viewpoint of forming the altered layer.

When the laser light is irradiated from the side of the supporting body, the laser light is preferably irradiated to the whole surface uniformly or irradiated to the crystal layer according to a predetermined pattern for performing the patterning of the altered layer. Thus, after the crystal of the nitride of the group 13 element is formed on the seed crystal layer, it becomes possible to separate the crystal of the nitride of the group 13 element from the supporting body without generating the cracks.

According to the present embodiment, it is preferred that the planar pattern of the patterned altered layer is uniform in the surface plane in a plan view and that the same kind of pattern is periodically repeated. Specifically, the pattern may be a mesh, stripe, dot, spiral or the like.

The altered portion can be confirmed by a scanning type electron microscope. A system "H-9000NAR" manufactured by Hitachi High-Technologies Corporation is used and the acceleration voltage is 300 kV. In the case that the altered portion is a portion into which dislocation defects are introduced, it can be confirmed by the presence of a region darker than the seed crystal layer along the interface, based on an image of a cross section taken by a scanning type electron microscope of a sample of a thin piece. Further, in the case that the altered portion is amorphous, it can be confirmed by the presence of a region brighter than the seed crystal layer along the interface, based on the image of a cross section taken by the scanning type electron microscope.

The thickness of the altered portion may preferably be 10 nm or larger and more preferably be 20 nm or larger. On the viewpoint of reducing the voids, the thickness of the altered portion may preferably be 100 nm or smaller.

Then, the crystal of the nitride of the group 13 element is grown on the seed crystal layer. In this case, it is preferred to grow the crystal of the nitride of the group 13 element by the flux method, and ammonothermal, HVPE, MOCVD or MBE methods may be used. In the nitride of the group 13 element, the group 13 element means a group 13 element according to the Periodic Table determined by IUPAC. Specifically, the nitride of the group 13 element may preferably be GaN, AlN, InN, or the mixed crystals thereof.

On the viewpoint of making the crystal of the nitride of the group 13 element free-standing after the separation from the supporting body, the thickness of the crystal of the nitride of the group 13 element may preferably be 300 μm or larger and more preferably be 500 μm or larger. Further, on the viewpoint of facilitating the spontaneous separation of the nitride of the group 13 element, the thickness may preferably be 1000 μm or larger.

The crystal of the nitride of the group 13 element may preferably be a single crystal. The single crystal referred to in the present specification is defined as follows. Although the single crystal includes typical single crystals where atoms are regularly arranged throughout the whole of the crystal, "single crystal" is not limited to such typical ones and includes those generally referred to in the Industries. That is, the single crystal may include some degree of defects, or may include internal stress, or may contain impurities in the crystal structure, and includes those called single crystal which is distinguishable from poly crystals (ceramics).

In the case that the crystal of the nitride of the group 13 element is grown by the flux method, as long as the nitride crystal can be generated, the type of the flux is not particularly limited. In a preferred embodiment, a flux containing at least one of an alkaline metal and an alkaline-earth metal is used, and the flux containing sodium metal may be particularly preferably used.

As the flux, a metal raw material is mixed and used. As such a metal raw material, for example, a single metal, an alloy or a metal compound may be used. In terms of handling, the single metal may be used preferably.

The growth temperature of the crystal of the nitride of the group 13 element in the flux method and the holding time during the growth are not particularly limited, and they are appropriately changed in accordance with the composition of the flux. As an example, when the crystal of the nitride of the group 13 element is grown using a flux containing sodium or lithium, the growth temperature may be preferably set to 800° C. to 950° C., and more preferably set to 850 to 900° C.

By the flux method, the crystal of the nitride of the group 13 element is grown in an atmosphere of a nitrogen-containing gas. For this gas, nitrogen gas may be preferably used, and ammonia may be used. The total pressure of the atmosphere is not particularly limited; but it may be preferably set to 10 atm or more, and further preferably 30 atm or more, from the standpoint of prevention against the evaporation of the flux. However, as the pressure is higher, an apparatus becomes larger. Therefore, the total pressure of the atmosphere may be preferably set to 2000 atm or less, and further preferably 500 atm or less. Any other gas except the nitrogen-containing gas in the atmosphere is not limited; but an inert gas may be preferably used, and argon, helium, or neon may be particularly preferably used.

According to a preferred embodiment, the crystal of the nitride of the group 13 element is separated from the supporting body. According to the present invention, by controlling the ratio of area of the altered layer in the plane of the supporting body, it is possible to realize the spontaneous separation of the crystal of the nitride of the grown group 13 element or to separate it by other methods. In the case of the spontaneous separation, the number of steps can be advantageously reduced. On the other hand, in the case that the crystal of the nitride of the group 13 element is separated by processing without the spontaneous separation, it is possible to control the conditions of the separation artificially, so that the yield can be further improved and the reduction of the yield accompanied with the increase of the size of the substrate can be reduced.

For separating the crystal of the nitride of the group 13 element from the supporting body by processing, the laser lift-off method or grinding is preferred. Even in the case that the crystal of the nitride of the group 13 element is separated from the supporting body by the processing, the yield is improved compared with the case without the altered layer. The reason is as follows. The thickness of the supporting body is made smaller by the grinding, for example, the supporting body is spontaneously peeled off from the altered portion as the starting point. On the other hand, in the case that the altered portion is not present, as the thickness of the sapphire substrate is reduced due to the grinding, a large stress is applied onto the crystal of the nitride of the group 13 element so that the cracks tend to occur in the crystal.

On the viewpoint of separating the crystal of the nitride of the group 13 element spontaneously from the supporting body, the ratio of the area of the altered portion with respect to the area of the main surface of the seed crystal layer may preferably be 80 percent or higher and more preferably be 90 percent or higher. The whole surface of the main surface of the seed crystal layer may be covered by the altered portion. Further, in the case that the crystal of the nitride of the group 13 element is separated from the supporting body by processing, the ratio of the area of the altered portion with respect to the area of the main surface of the seed crystal layer may preferably be 5 percent or higher and more preferably be 10 percent or higher.

A functional device structure is formed on the thus obtained crystal of the nitride of the group 13 element. This functional device structure may be used for a white LED with an improved brightness and color rendering index, a blue-violet laser for a high-speed and high-density optical memory, and a power device for an inverter for a hybrid car or the like.

EXAMPLES

Examples A1 to A7

A c-plane body 1 of sapphire single crystal with a diameter of 4 or 6 inches and a thickness of 1.3 mm was put in an MOCVD apparatus (metal organic chemical vapor deposition apparatus), and heated at 1150° C. for 10 minutes in a hydrogen atmosphere to perform the cleaning of the surface of the body. Then, the temperature of the body was lowered to 500° C., and the gallium nitride layer was grown to a thickness of 20 nm using TMG (trimethyl gallium) and ammonia as raw materials to provide the underlying layer. Next, the temperature of the body was raised up to 1100° C., and a seed crystal layer 2 of gallium nitride was grown to a thickness of 4 μm using TMG and ammonia as raw materials.

Then, laser light was irradiated from the side of the sapphire body 1 to form the altered portion.

As a laser light source, A pulse laser using a third harmonic wave (wavelength of 355 nm) of a Nd: YAG laser was used. The repetition frequency was 10 Hz, the pulse width was 10 nsec, the condensation was performed using a lens with a focal distance of 700 mm, a distance between the lens and the surface of the body was 400 mm, and the energy density was 90 mJ/cm$^2$. The laser light was scanned so that the intervals of irradiation dots by the pulse laser were made uniform in the horizontal and vertical directions and uniformly distributed over the whole plane of the body.

Figure 4:
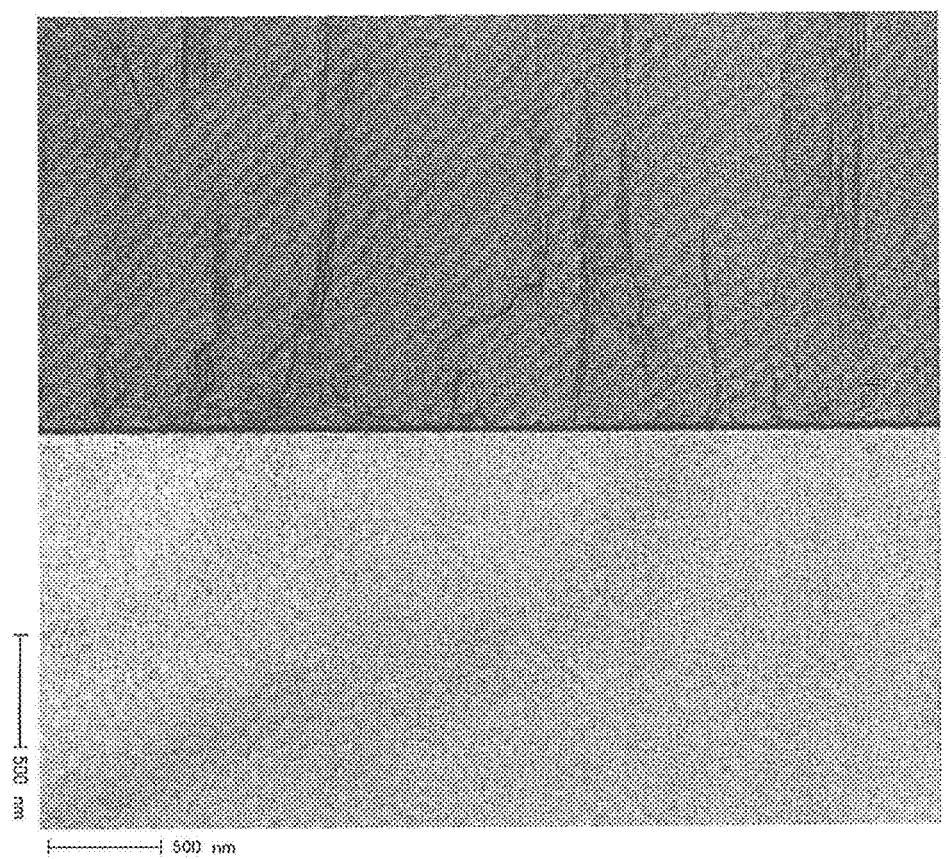
FIG. 4 is a photograph (50,000 times) taken by a transmission electron microscope showing the supporting body, altered portion and seed crystal layer.
Figure 5:
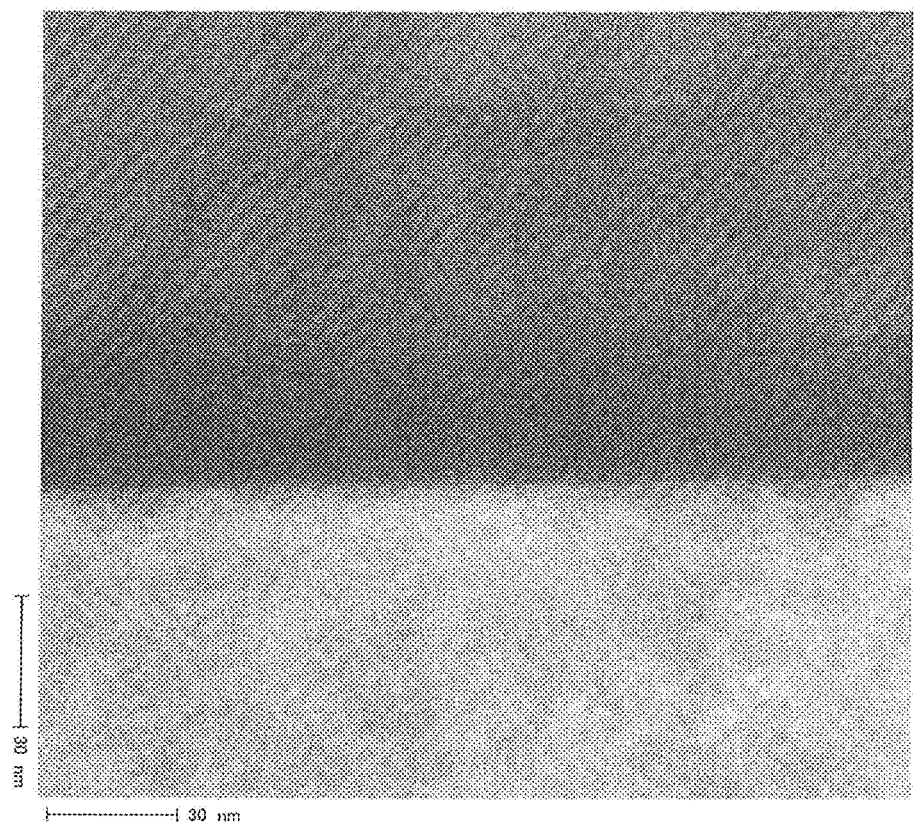
FIG. 5 is a photograph (1,000,000 times) taken by a transmission electron microscope showing the supporting body, altered portion and seed crystal layer.

Further, the ratio of the area of the dislocation defect portions generated by the laser irradiation with respect to the area of the main surface of the seed crystal layer was changed as shown in table 1. Further, the thus obtained seed crystal layers were taken out of the furnace and then the respective substrates were cleaved to obtain thinned samples. As to the thinned samples, the cross sections of the sapphire body and seed crystal layer thereon were observed by a scanning type electron microscope. As the scanning type electron microscope, "H-9000NAR" manufactured by Hitachi High-Technologies Corporation was used. Among them, as to example A1, FIG. 4 shows a photograph with a magnification of 50,000, and FIG. 5 shows a photograph with a magnification of 1,000,000. It was clearly shown that the dislocation defect portion was formed along the interface.

The seed crystal substrate was then subjected to cleaning with acetone for 10 minutes, ultrasonic cleaning with isopropyl alcohol for 10 minutes and cleaning with flowing pure water for 10 minutes.

Gallium nitride crystal was then grown on each of the seed crystal substrates by the Na flux method.

The seed crystal substrate was set on a bottom part of a cylindrical alumina crucible with a flat bottom having an inner diameter of 190 mm and a height of 45 mm, and a melt composition was filled in the crucible in a glove box. The composition of the melt composition was as follows.

Ga metal: 200 g

Na metal: 200 g

The alumina crucible was contained and sealed in a container made of a heat-resistant metal, which was mounted on a table capable of rotation in a crystal growth furnace. The container was heated and pressurized at 870° C. and 4.0 MPa under a nitrogen atmosphere, and the generated solution was stirred by rotation so that gallium nitride crystal was grown for 30 hours. After the completion of the crystal growth, it was cooled to room temperature over 3 hours, and the growth container was taken out of the crystal growth furnace. Ethanol was used to remove the melt composition left in the crucible to collect a sample with gallium nitride crystal grown thereon. It was proved that gallium nitride crystal 6 was formed as a film having a thickness of 600 μm in each of the samples.

However, according to Example A6, the gallium nitride layer was grown by HVPE method. The seed crystal substrate was contained in an HVPE apparatus, and gallium (Ga) metal and hydrogen chloride (HCl) gas on a source boat heated at 800° C. were reacted with each other to generate gallium chloride (GaCl) gas. The gallium chloride (HCl) gas, ammonia (NH$_3$) gas as raw material gases and hydrogen as a carrier gas were supplied onto the main surface of the heated seed crystal substrate, so that gallium nitride crystal was grown on the seed crystal substrate. As to the crystal growth, a buffer layer of gallium nitride was deposited in 40 nm thickness on the seed crystal substrate heated at 550° C., and the temperature was elevated to 1100° C. so that gallium nitride was grown for 3 hours. It was found that gallium nitride crystal 6 with a thickness of 600p m was grown.

Then, in the respective examples, the gallium nitride crystal was separated from the supporting body by laser lift-off method. Laser light was irradiated from the side of the sapphire substrate. As a laser light source, a pulse laser using a third harmonic wave (wavelength of 355 nm) of Nd:YAG laser was used. The repetition frequency was 10 Hz, the pulse width was 10 nsec, the condensation was performed using a lens with a focal distance of 700 mm, a distance between the lens and the surface of the body was 400 mm, and the energy density was 500 mJ/cm$^2$. The whole of the substrate was scanned so that irradiation dots by the pulse laser overlap each other.

Then, in each example, FIG. 1 shows the yield in the cooling step directly after the gallium nitride crystal was grown, yield after the separation of the gallium nitride crystal by laser lift-off method, and amount of bowing of the thus obtained free-standing substrate.

Comparative Examples A1 and A2

A seed crystal substrate and gallium nitride crystal were grown as the Examples, and the gallium nitride crystal was separated from the supporting body by the laser lift-off method. However, according to comparative examples A1 and A2, the size of the substrate was made 4 or 6 inches, and the formation of the altered portion by the laser irradiation was not performed. The measurement results were shown in Table 1.

TABLE 1

| | formation of portion with dislocation defects introduced by laser irradiation Area of portion with dislocation defects introduced [%] (Ratio to area of substrate) | Size of substrate [inch] | GaN crystal 6 | | yield direct after cooling (percentage of samples without cracks) | Yield after laser lift-off step (percentage of samples without cracks) | Bowing amount of free-standing substrate after laser lift-off step (average value) [μm] |
|---|---|---|---|---|---|---|---|
| | | | formation method | thickness [μm] | | | |
| Ex. A1 | 100 | 4 | flux method | 600 | 100% | 100% | 198 |
| Ex. A2 | 90 | 4 | flux method | 600 | 100% | 100% | 211 |
| Ex. A3 | 70 | 4 | flux method | 600 | 100% | 100% | 219 |
| Ex. A4 | 30 | 4 | flux method | 600 | 90% | 100% | 326 |
| Ex. A5 | 10 | 4 | flux method | 600 | 80% | 100% | 355 |
| Ex. A6 | 70 | 4 | HVPE | 600 | 100% | 100% | 272 |
| Ex. A7 | 70 | 6 | flux method | 600 | 100% | 100% | 494 |
| Com. Ex. A1 | none | 4 | flux method | 600 | 70% | 71% | 609 |
| Com. Ex. A2 | none | 6 | flux method | 600 | 40% | 50% | 1353 |

According to Examples A1 to A5, the yield of the cooling step, the yield of the separation step by laser lift-off and amount of bowing of the free-standing substrate after the separation were good. According to Example A6, the growing method of the crystal layer of gallium nitride was changed to the HVPE method, and similar results were obtained. Further, according to Example A7, the size of the substrate was enlarged to 6 inches, and good results were still obtained.

According to comparative Examples A1 and A2, the yield of the cooling step, the yield during the separation by laser lift-off and amount of bowing of the free-standing substrate after the separation were inferior to those in the Examples.

Example B1

The seed crystal substrate was produced and gallium nitride layer was grown thereon as Example A3. Then, the supporting body was processed by grinding so that the gallium nitride crystal layer was separated to obtain a free-standing substrate. Then, the yield of the cooling step, the yield of the separation by grinding and amount of bowing of the free-standing substrate after the separation were measured and shown in Table 2.

Comparative Example B1

The seed crystal substrate was produced and gallium nitride layer was grown thereon as Example B1. Then, the supporting body was processed by grinding so that the gallium nitride layer was separated from the supporting body. However, the formation of the altered portion by laser irradiation was not performed. The results of measurements were shown in Table 2.

TABLE 2

| | formation of portion with dislocation defects introduced by laser irradiation Area of portion with dislocation defects introduced [%] (Ratio to area of substrate) | Size of substrate [inch] | GaN crystal 6 | | yield direct after cooling (percentage of samples without cracks) | Yield after grinding step (removal of sapphire) (percentage of samples without cracks) | Bowing amount of free-standing substrate after laser lift-off step (average value) [μm] |
|---|---|---|---|---|---|---|---|
| | | | formation method | thickness [μm] | | | |
| Ex. B1 | 70 | 4 | flux method | 600 | 100% | 90% | 182 |
| Com Ex. B1 | なし | 4 | flux method | 600 | 70% | 29% | 529 |

According to Example B1, good results were obtained. On the other hand, according to Comparative Example B1, the yield directly after the cooling step was low, the yield after the grinding process was low and the amount of bowing of the free-standing substrate was increased.

Examples C1 to C6

The seed crystal substrate was produced and gallium nitride crystal layer was grown as Example A. However, according to the present examples, the thickness of the gallium nitride layer was made as large as 1400 μm, so that the gallium nitride crystal layer was separated from the supporting body due to spontaneous separation during the cooling step.

Comparative Example C1

The seed crystal substrate and gallium nitride crystal layer were grown as Examples C1 to C5. However, according to the present Example, the formation of the altered portion by laser irradiation was not performed. The measurement results are shown in Table 3.

TABLE 3

| | formation of portion with dislocation defects introduced by laser irradiation Area of portion with dislocation defects introduced [%] (Ratio to area of substrate) | Size of substrate [inch] | GaN crystal 6 | | | Bowing amount of free-standing substrate after spontaneos separation (average value) [μm] |
|---|---|---|---|---|---|---|
| | | | formation method | thickness [μm] | yield direct after cooling | |
| Ex. C1 | 100 | 4 | flux method | 1400 | 80% | 349 |
| Ex. C2 | 90 | 4 | flux method | 1400 | 80% | 357 |
| Ex. C3 | 70 | 4 | flux method | 1400 | 60% | 371 |
| Ex. C4 | 30 | 4 | flux method | 1400 | 40% | 442 |
| Ex. C5 | 10 | 4 | flux method | 1400 | 40% | 506 |
| Ex. C6 | 90 | 4 | HVPE | 1400 | 70% | 551 |
| Com. Ex. C1 | None | 4 | flux method | 1400 | 10% | 3148 |

According to Examples C1 to C5, the yield after the spontaneous separation directly after the cooling step and amount of bowing of the free-standing substrate after the separation were good. According to Example C6, the growing method of the gallium nitride layer was changed to the HVPE method and similar results were obtained.

According to Comparative Example C1, the yield after the spontaneous separation during the cooling was low and the amount of bowing of the free-standing substrate was increased.

What is claimed is:

1. A method of producing a seed crystal substrate, the method comprising the steps of:
   providing a seed crystal layer comprising a nitride of a group 13 element on a supporting body; and
   irradiating a laser light from a side of said supporting body to provide an altered portion along an interface between said supporting body and said seed crystal layer, said altered portion comprising said nitride of said group 13 element and comprising a portion with dislocation defects introduced therein or an amorphous portion,
   wherein the laser light is irradiated at an optical energy such that voids are not generated along the interface between the supporting body and seed crystal layer.

2. The method of claim 1, wherein a plurality of altered portions are provided along said interface between said supporting body and said seed crystal layer, said altered portions are separated from each other.

3. A method of producing a crystal of a nitride of a group 13 element: the method comprising the steps of:
   providing a seed crystal layer comprising a nitride of a group 13 element on a supporting body;
   irradiating a laser light from a side of said supporting body to provide an altered portion along an interface between said supporting body and said seed crystal layer, said altered portion comprising said nitride of said group 13 element and comprising a portion with dislocation defects introduced within or an amorphous portion; and
   growing said crystal of said nitride of said group 13 element on said seed crystal layer,
   wherein the laser light is irradiated at an optical energy such that voids are not generated along the interface between the supporting body and seed crystal layer.

4. The method of claim 3, further comprising the step of separating said crystal of said nitride of said group 13 element from said supporting body.

5. The method of claim 4, wherein a laser light is irradiated from said side of said supporting body to separate said crystal of said nitride of said group 13 element from said supporting body by laser lift-off method.

6. The method of claim 4, wherein said supporting body is subjected to grinding to obtain a free-standing substrate comprising said crystal of said nitride of said group 13 element.

7. The method of claim 4, further comprising a cooling step after said crystal of said nitride of said group 13 element is grown, wherein said crystal of said nitride of said group 13 element is spontaneously separated from said supporting body during said cooling step.

8. The method of claim 3, wherein said crystal of said nitride of said group 13 element is grown by flux method.

9. The method of claim 3, wherein a plurality of altered portions are provided along said interface between said supporting body and said seed crystal layer, and wherein said altered portions are separated from each other.

10. A seed crystal substrate comprising:
    a supporting body;
    a seed crystal layer provided on said supporting body and comprising a nitride of a group 13 element; and
    an altered portion of the seed crystal layer provided along an interface between said supporting body and said seed crystal layer, said altered portion comprising said nitride of said group 13 element and comprising a portion with dislocation defects introduced therein or an amorphous portion,
    wherein voids are not present along the interface between the supporting body and seed crystal layer.

11. The seed crystal substrate of claim 10, comprising a plurality of altered portions separated from each other.

* * * * *